United States Patent [19]

Shepherd, Jr. et al.

[11] 4,016,416
[45] Apr. 5, 1977

[54] PHASE COMPENSATED ZONE PLATE PHOTODETECTOR

[75] Inventors: Freeman D. Shepherd, Jr., Chelmsford; Sven A. Roosild, Framingham, both of Mass.

[73] Assignee: The United States of America as represented by the Secretary of the Air Force, Washington, D.C.

[22] Filed: Mar. 23, 1976

[21] Appl. No.: 669,584

[52] U.S. Cl. .............................. 250/211 J; 250/216; 350/162 ZP
[51] Int. Cl.² .......................................... H01J 39/12
[58] Field of Search ............ 250/211 R, 211 J, 216; 350/162 ZP, 211, 294; 357/29, 30

[56] References Cited

UNITED STATES PATENTS

| | | | |
|---|---|---|---|
| 3,631,360 | 12/1971 | Lehovec | 350/162 ZP |
| 3,668,404 | 6/1972 | Lehovec | 250/211 J |
| 3,902,794 | 9/1975 | Abrams | 350/211 |

Primary Examiner—David C. Nelms
Attorney, Agent, or Firm—Joseph E. Rusz; Henry S. Miller

[57] ABSTRACT

A radiation transparent base having a number of coincentric Fresnel rings mounted on one face, and one-quarter wavelength in thickness and a reflective coating covering the face and rings and a detector mounted on the opposite face to collect reflected in phase radiation.

7 Claims, 1 Drawing Figure

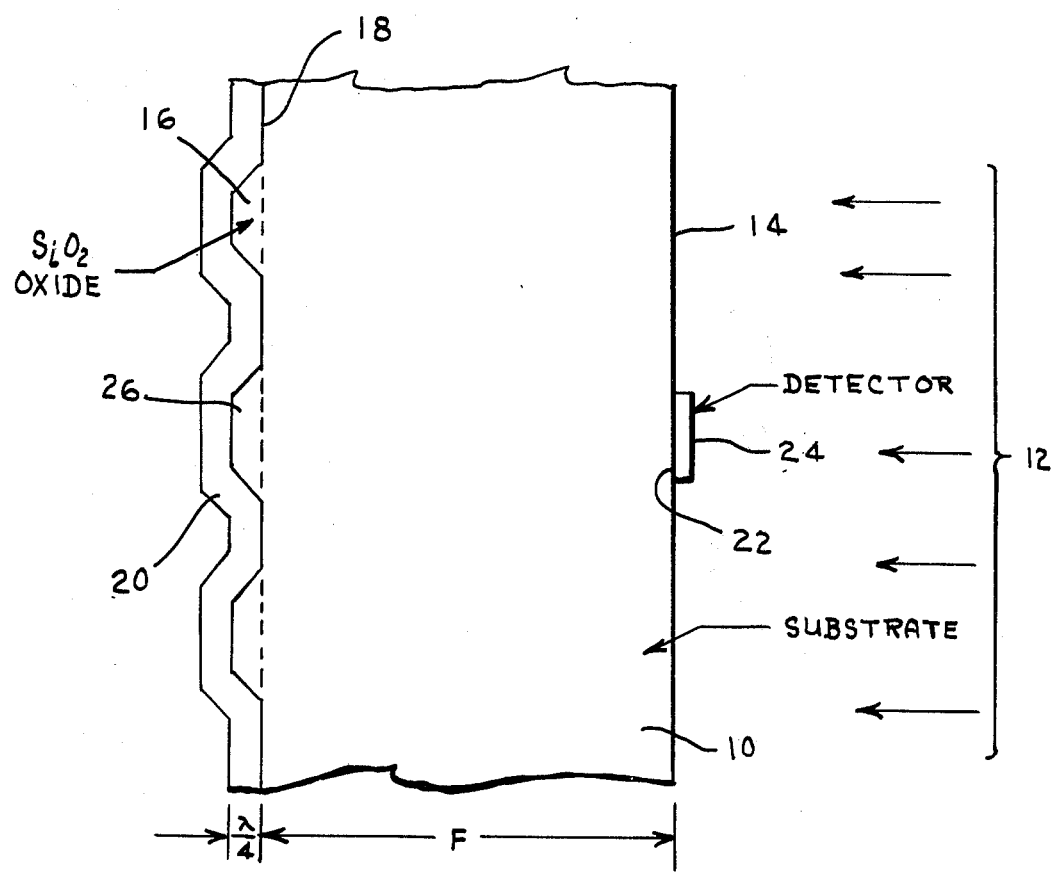

PHASE COMPENSATED ZONE PLATE PHOTODETECTOR

STATEMENT OF GOVERNMENT INTEREST

The invention described herein may be manufactured and used by or for the Government for governmental purposes without the payment of any royalty thereon.

BACKGROUND OF THE INVENTION

This invention relates generally to zone plate photodetection, and more particularly, to such a detector that provides phase compensation.

Zone plate optics are well known in the art and not infrequently referred to as Fresnel zones after one of the early researchers in the field. While generally zone plate technology has been applied to imaging and radiation detection in various regions of the spectrum, including microwave and X-ray, they also have application with interferometers and spectrometers.

Concerning the radiation detection aspect of Fresnel zone plates, the most recent advances in the art involve the integration of zone plate optics with microcircuits and various electro-optic and photo-electric devices. These advances particularly in mineaturization have necessitated corresponding changes in the optical systems.

It is well known in the art that ring patterns inscribed on a plane have the ability to focus light. A zone plate consists of a series of coincentric rings in a plane, where the ring radii are given by the formula:

$$\gamma_K = \sqrt{\frac{K \lambda F}{\mu} + \frac{K^2 \lambda^2}{4 \mu^2 F^2}} \quad (1)$$

where
  K ring number from center
  $\lambda$=wavelength of light
  F=distance from zone plate to point of focus (focal length)
  $\mu$=refractive index of medium through which light passes.

this equation (1) can be approximated by $$\gamma_K = \sqrt{\frac{K \lambda F}{\mu}} \quad (2)$$

for purposes of design. The rings given by (1) define zones which have an average distance $d$, from the focus of $$d = F + K \frac{\pi}{2} \frac{\lambda}{\mu} \quad (3)$$

Thus adjacent zones are separated from the focus by distances that differ by one half wavelength and hence light from these zones interferes destructively and light cancellation takes place.

However, if alternate zones are blocked, all light arrives at the focus "in-phase" and constructive interference is achieved with a resulting bright area or spot. A zone plate with alternate transparent and opaque zones is known in the art as an opaque-transparent zone plate.

Another zone plate structure is the phase reversal zone plate. This zone plate differs from the opaque-transparent plate by adding a dielectric to every other zone which has a thickness, $$t = \frac{\lambda}{2} \cdot \frac{1}{\mu - 1} \quad (4)$$

This added layer cuases a phase shift in the light of every other zone by radius, whereby all zones will transmit in phase.

Although the phase shift zone plate proves to be four times more efficient in focusing than the alternative opaque transparent zone plate, it is difficult to produce because of the thickness required by equation (4) is often large compared to the zone width in devices having more than a few rings. In these cases practical problems, such as etch undercutting of the dielectric during fabrication, limits the device resolution.

Accordingly, the invention described hereinafter involves a phase reversal zone plate detector that is simpler to produce and compatable with recent advances in the electronic detector field.

SUMMARY OF THE INVENTION

The invention utilizes a wafer of radiation transparent substrate material. A series of coincentric radiation transparent zone plate rings are placed on the substrate on the face away from the incident monochromatic radiation. The dimensions of the rings are given by equation (1). Covering the entire face of the substrate, including the zone plate rings is a mirror which reflects incident radiation to a detector located on the face of the substrate receiving incident radiation.

The zone plate rings are so constructed as to be one quarter wavelength in thickness. As a result radiation out of phase with the incident radiation will travel an additional one half wavelength in being reflected to the detector. This change creates a 180° phase shift and as a result, the phase corrected radiation will reinforce the radiation reflected from the mirror at the substrate-mirror interface. The net result of the invention is to enlarge the effective surface of the detector while reducing the size of the substrate upon which it rests.

It is therefore an object of the invention to provide a new and improved phase reversal zone plate detector.

It is another object of the invention to provide a new and improved phase reversal zone plate detector that reduced in size from any like known devices.

It is a further object of the invention to provide a new and improved phase reversal zone plate detector that is more easily produced than any known similar device.

It is still another object of the invention to produce a new and improved phase reversal zone plate detector that is more efficient than similar like devices.

It is still a further object of the invention to provide a new and improved phase reversal zone plate detector that may be produced without the need of special equipment.

It is another object of the invention to provide a new and improved phase reversal zone plate detector that may be readily utilized with mineaturized electronics.

These and other advantages, features and objects of the invention will become more apparent from the following description taken in connection with the illustrative embodiment in the accompanying drawing.

DESCRIPTION OF THE DRAWING

The FIGURE is a view in crossection of the invention.

DESCRIPTION OF THE PREFERRED EMBODIMENT

Referring now to the FIGURE, a wafer 10 of radiation transparent substrate material is adopted to receive monochromatic radiation of at varying phases 12 through face 14. A series of coincentric radiation transparent zone plate rings, 16 one quarter wavelength in thickness are formed on the reverse side of the substrate 18. The rings may be formed by evaporation or oxidation followed by photolithographic processing and etching is known in the art.

A radiation reflecting mirror 20 of metal or other suitable material is evaporated over the entire face of the substrate, including zone plate rings 16.

In operation, radiation 12 entering the substrate, passes through the body of the substrate to the interface 18. At this point radiation in phase will be reflected back to the entrance 22 of the detector 24. Radiation out of phase will pass through the interface 18 and strike the mirror surface at 26 where it will have travelled one quarter wavelength 28 farther than the aforesaid reflected radiation. Upon reflection, the wave will focus on the detector entrance 22 again traveling an additional one quarter wavelength 30. The additional distance travelled will shift the phase by 180° whereby radiation entering the detector will be the same as that striking the substrate-mirror interface 18 and increasing radiation input to the detector 24.

The invention is readily adaptable to both visible and invisible radiation. For example, if the substrate layer were a dielectric such as silicon or other conventional semiconductor and the detector a metal absorption Schottky barrier, certain ranges of invisible radiation could be detected. If the dielectric layer were glass or sapphire and the detector either a conventional p-n junction or photo conductive device, the visible range would be detected.

It should be understood, of course, that the foregoing disclosure relates to only a preferred embodiment of the invention and that numberous modifications or alterations may be made therein without departing from the spirit and scope of the invention as set forth in the appended claims.

What is claimed is:

1. A phase compensated zone plate photodetector comprising: a base of material transparent to radiation; a plurality of coincentric rings, transparent to radiation mounted on one face of said base; a radiation reflective material overcovering the said face of the base and rings mounted thereon, and radiation detection means for receiving reflected radiation mounted on a second face of said base.

2. A phase compensated zone plate photodetector according to claim 1 wherein said base material is silicon.

3. A phase compensated zone plate photodetector according to claim 2 wherein, said rings are formed of silicon dioxide.

4. A phase compensated zone plate photodetector according to claim 3 wherein, said detector is a Schottky barrier.

5. A phase compensated zone plate photodetector according to claim 1 wherein the base material is glass.

6. A phase compensated zone plate photodetector according to claim 5 wherein the detector is a p-n junction.

7. A phase compensated zone plate photodetector according to claim 1 wherein said rings thickness measures one quarter the wavelength of the incident radiation.

* * * * *